(12) United States Patent
Nakahara et al.

(10) Patent No.: US 6,639,241 B2
(45) Date of Patent: Oct. 28, 2003

(54) OPTICAL DEVICE USING SEMICONDUCTOR

(75) Inventors: Kouji Nakahara, Kunitachi (JP); Tsurugi Sudo, Pasadena, CA (US)

(73) Assignee: Hitachi, Ltd., Tokyo (JP)

( * ) Notice: Subject to any disclaimer, the term of this patent is extended or adjusted under 35 U.S.C. 154(b) by 1 day.

(21) Appl. No.: 10/073,030

(22) Filed: Feb. 12, 2002

(65) Prior Publication Data

US 2003/0042476 A1 Mar. 6, 2003

(30) Foreign Application Priority Data

Aug. 29, 2001 (JP) ........................................ 2001-259141

(51) Int. Cl.$^7$ ............................................. H01L 29/06
(52) U.S. Cl. ........................... 257/14; 257/12; 257/101; 257/103
(58) Field of Search ........................ 257/10–18, 79–103

(56) References Cited

U.S. PATENT DOCUMENTS 5,901,265 A * 5/1999 Tohyama et al. ............ 385/131

FOREIGN PATENT DOCUMENTS

JP          9-45999       2/1997    ............. H01S/3/18

OTHER PUBLICATIONS

T. Fukushima, et al., "Wideband and High–Power Compressively Strained GaInAsP/InP Multiple–Quantum–Well Ridge Waveguide Lasers Emitting at 1.3 $\mu$m", IEEE Photonics Technology Letters, vol. 5, No. 9, Sep. 1993, pp. 963–965.

* cited by examiner

Primary Examiner—David Nelms
Assistant Examiner—Andy Huynh
(74) Attorney, Agent, or Firm—Antonelli, Terry, Stout & Kraus, LLP

(57) ABSTRACT

In a ridge type semiconductor optical device in which both sides of the mesa stripe are recessed each into a rectangular shape by a depth reaching an active layer, a semiconductor optical device having a structure in which a structure that obstructs conductivity is disposed at a portion on the bottom of a rectangular shape. The structure that obstructs conductivity is attained, for example, by a structure in which impurities are ion implanted into a semiconductor.

16 Claims, 11 Drawing Sheets

CURRENT FLOW

OPTICAL DEVICE USING SEMICONDUCTOR

BACKGROUND OF THE INVENTION

The present invention concerns an optical device using semiconductor and, more in particular, it relates to a laser device and an optical waveguide stripe device using a semiconductor material or an integrated optical semiconductor device integrating them.

Semiconductor lasers that have been generally used in various industries such as optical communication or optical recording have been demanded to have high performance, particularly, high speed operation at a reduced cost along with starting an increase in the transmission capacity in the optical communication by the development of the Internet particularly in recent years. As lasers that are advantageous for reducing the cost, a ridge waveguide laser of a simple manufacturing process has been known. Such an example is shown, for example, by T. Fukushima in IEEE Photonics Technology Letters, Vol. 5, No. 9, 1993, pp. 963–965. FIG. 2 shows an example of a cross sectional view of a ridge waveguide laser. As shown in the cross sectional view of FIG. 6, a lower cladding layer, an active layer containing an SCH layer and an upper cladding layer are successively grown in a stacked structure, and the upper cladding layer is removed leaving a mesa stripe by selective etching. In FIG. 6, are shown an n-InP substrate 1 which also serves as a lower cladding layer, an n-InGaAsP guide layer 2, an InGaAsP multi-quantum well active layer 3, a p-InGaAsP guide layer 4, a p-InP upper cladding layer 5, and a contact layer 6 for ohmic connection with an upper electrode 8. For the contact layer, InGaAs lattice-matched with the InP substrate is used. Reference numeral 7 denotes an $SiO_2$ insulation film that electrically insulates semiconductors 4, 5 and the upper electrode 8 in an area other than the contact layer 6 and current flows through the contact layer to the active layer. Reference numeral 9 denotes a lower electrode. Since the ridge semiconductor laser can be manufactured by crystal growth for once, costs therefor can be reduced compared with existent buried type semiconductor lasers that require two or three steps of crystal growing.

SUMMARY OF THE INVENTION

A first subject of this invention is to provide a configuration capable of decreasing parasitic elements and attaining a high-speed response in a ridge waveguide laser. A second subject is to provide a configuration having a high reliability in a ridge waveguide laser with reduced parasitic elements.

The first and the second subject described above can be attained in a ridge waveguide semiconductor optical device in which both sides of a mesa stripe are recessed, for example, into a rectangular shape by a depth not reaching the active layer, wherein the structure that obstructs conductivity is disposed at a portion on the bottom of the rectangular shape. A typical example for the conductivity obstructing structure is attained by a groove or a structure in which impurities are ion implanted into semiconductors.

A typical example of this invention is a semiconductor optical device at least comprising a first cladding layer region of a first conduction type, an active layer region, a second cladding layer region of a second conduction type in a ridged stripe shape formed on the active layer region, a first electrode on the side of the first cladding layer region and a second electrode on the side of the second cladding layer region. Then, semiconductor regions of a desired elongated shape are arranged on both sides of the ridged stripe shape. A recess is formed between the ridged stripe shape region and each of the region of the elongate shape, and a depth of the recess doesn't reach the active layer region.

The device further has the following three features: (1) At least a portion that obstructs conductivity is provided at a portion of the recess. (2) The second electrode is extended on at least one of the first and the second semiconductor region of the elongated shape.

(3) The distance between each of the sides of the ridged stripe shape region and the portion that obstructs conductivity along the propagating direction of light is 2 $\mu$m or more and not exceeding 10 $\mu$m.

As a semiconductor optical device according to this invention, a semiconductor laser device is a typical example. In addition, this invention is applicable also to an optical device having an optical waveguide, which should avoid diffusion of carriers in the lateral direction of the active layer region. This example is, for instance, a semiconductor optical modulator. Alternatively, this invention is applicable to a semiconductor integrated optical device in which such semiconductor optical devices are mounted on one substrate.

DESCRIPTION OF THE PREFERRED EMBODIMENTS

Figure 1:
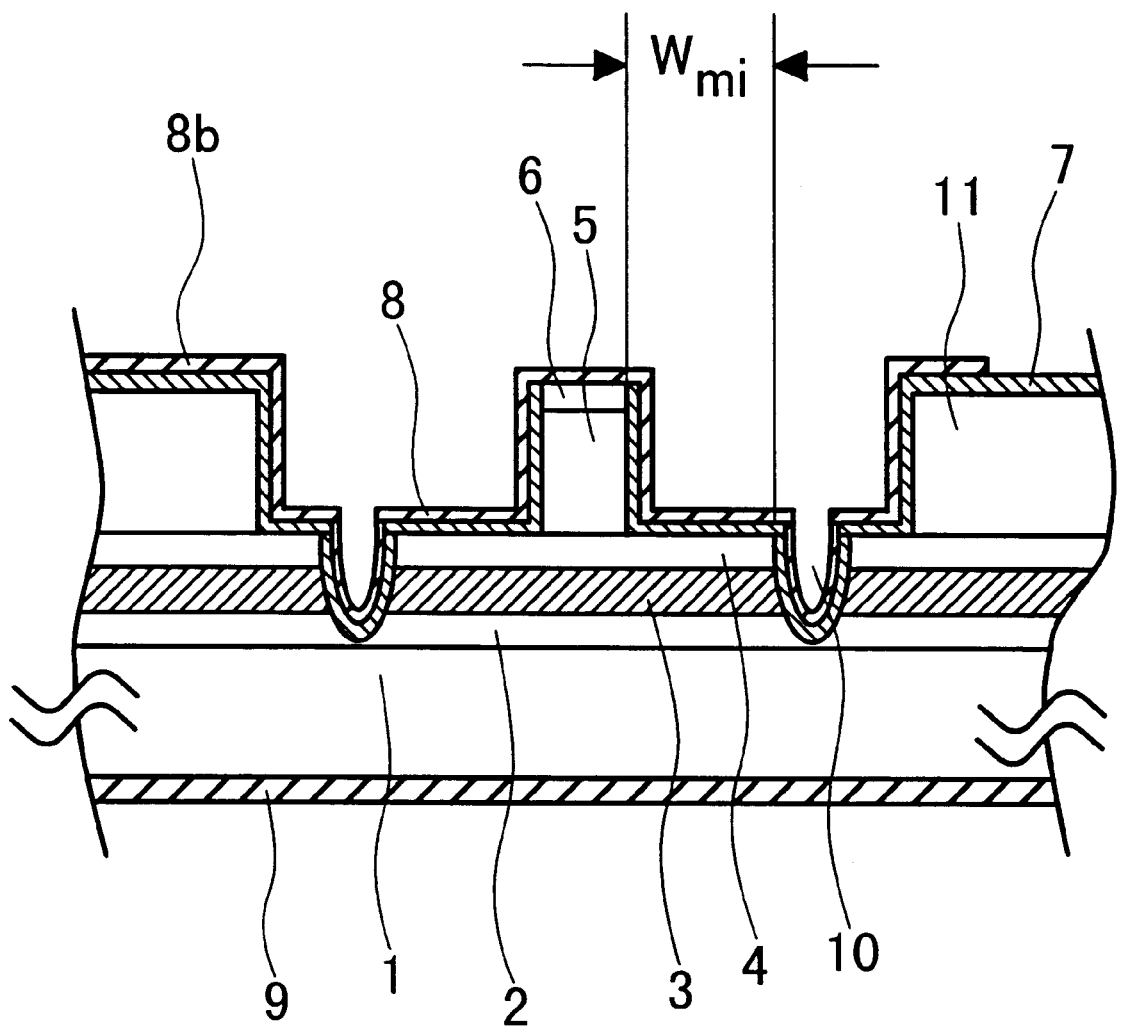
FIG. 1 is a cross sectional view taken along a plane perpendicular to the propagating direction of light in an embodiment of this invention.
Figure 2:
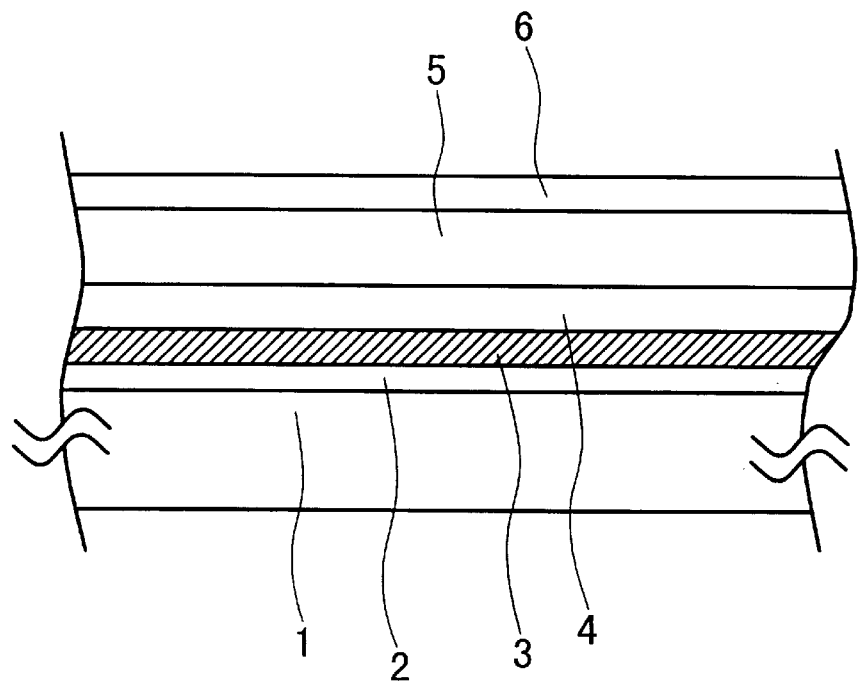
FIG. 2 is a cross sectional view of a semiconductor optical device according to an embodiment of this invention in the order of manufacturing step.

Prior to the description of embodiments, typical forms of this invention will be explained specifically.

A portion that obstructs conductivity can be formed with at least a groove portion or an ion implantation portion. Ion implantation makes desired semiconductor regions highly resistive or insulative. As atoms for the ion implantation, H, Fe and Ti may be used for instance. It will be apparent that any conductivity-obstructing portion may be used so long as it can block the flow of carriers in a direction within the plane. In addition, customary means used for the field of semiconductors to make the semiconductor layer highly resistive or insulative may be used.

In view of the principal object of this invention, it is desirable that the portion that obstructs conductivity is disposed from the upper surface of a recess formed between the region of the ridged stripe shape and each of the first and the second semiconductor region of elongated shape. Moreover, it is desirable that the portion that obstructs conductivity reaches at least to the lower end of the active layer region. Therefore, diffusion of the carriers in the lateral direction can be blocked effectively.

The distance between each of the sides of the ridged stripe shape region and the portion that obstructs conductivity along the propagating direction of light is determined in view of two points, namely, (1) reducing capacitance of p-i-n semiconductor laser diode strucutre, and (2) preventing to increase in carrier flow along a boundary between the portion that obstructs conductivity and active layer below the recess so as to extend the lifetime. In view of the former condition, it is necessary that the distance does not exceed 10 $\mu$m. It is more preferably 7 $\mu$m or less. On the other hand, in view of the latter condition, it is necessary that the distance is 2 $\mu$m or more. They are to be explained more specifically in preferred embodiments with reference to actual examples.

It is useful that the height of the region of the ridged stripe shape is substantially identical to that of the region of the elongated shape. The region of the ridged stripe shape is not protruded and protected by two regions of the elongate shape sandwiching the same. Accordingly, injury during a manufacturing step can be prevented. Therefore, the semiconductor optical device of this invention can be manufactured at a high yield.

For the active layer region, conventional multi-quantum well structure can be adopted depending on the purpose. In this case, it will be apparent that a pseudomorphic multi-quantum well structure, strain-compensated multi-quantum well structure or single quantum well structure may also be used.

Furthermore, in the active layer region, a semiconductor layer having a refractivity greater than that of the first and second cladding layers and preventing leakage of light from the active layer region can be disposed. Usually, the semiconductor layer is referred to as a light-confining layer. It is of course possible to use other optical guide layers optionally.

For the semiconductor materials per se constituting the semiconductor optical device, conventional materials can be used depending on the purpose. In the semiconductor laser device for optical communication use, InGaAlAs, InGaAsP and the like are frequently used for the active layer region. The material is selected depending on the wavelength band such as a 1.3 $\mu$m band or 1.5 $\mu$m band. Further, InAlAs is used as a portion of the cladding layer region. Since InAlAs has a large discontinuation of the band on the side of the conduction band in the band profile, when it is used for the p-side cladding layer, leakage of electrons from the quantum well layer can be prevented more preferably.

Embodiment 1

Figure 10:
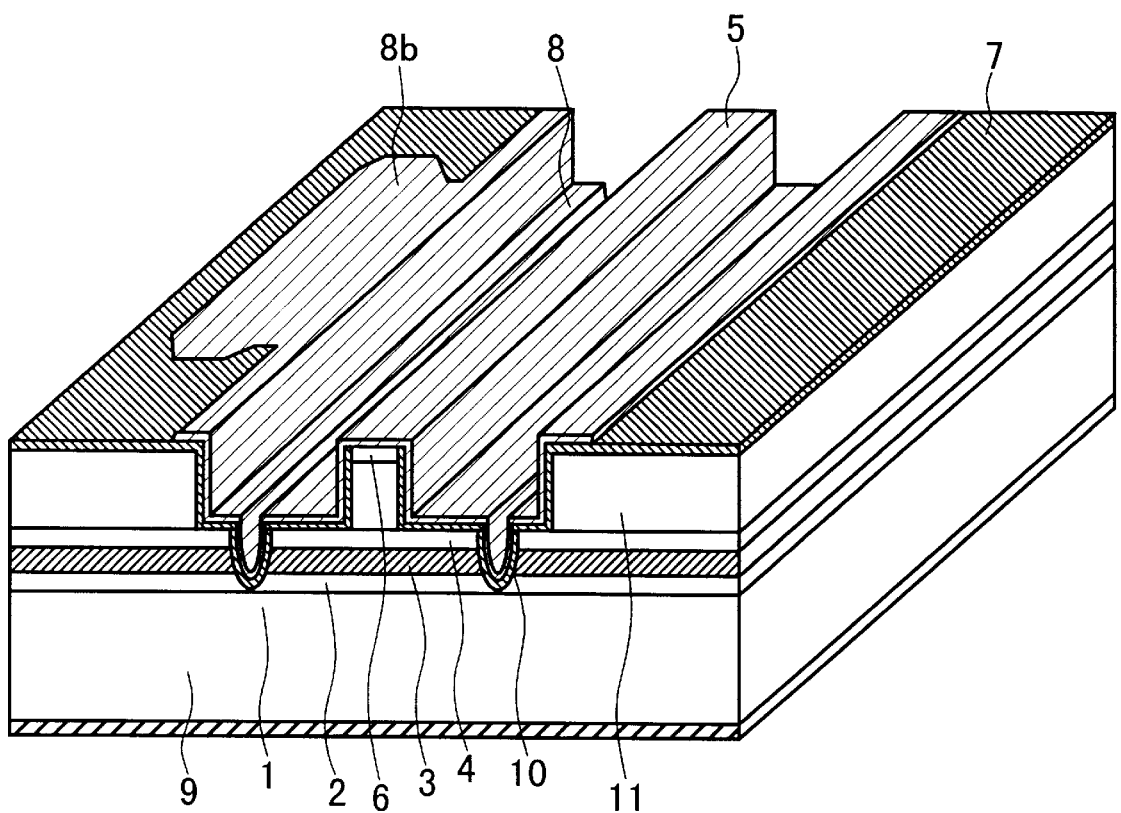
FIG. 10 is a perspective view showing an embodiment of this invention.

A first embodiment is an example of applying the present invention to a semiconductor laser emitted at 1.3-$\mu$m wavelength for optical fiber communication. FIG. 1 is a cross sectional view taken along a plane perpendicular to the propagating direction of light, and FIG. 10 is a perspective view thereof. FIGS. 2 to 5 are cross sectional views of a semiconductor optical device shown in the order of steps for manufacturing the device.

In the example shown in FIG. 1, an n-InP substrate 1 serves also as a lower cladding layer. An embodiment of forming a cladding layer on a semiconductor substrate can of course be used. On the InP substrate, are stacked an n-InGaAsP guide layer 2 of 0.08 $\mu$m in thickness at a carrier concentration of $1 \times 10^{18}$ cm$^{-3}$, an undoped InGaAsP pseudomorphic multi-quantum well active layer having a well layer 3 of 6 $\mu$m in thickness with compression strain of 1.2%, a p-InGaAsP guide layer 4 of 0.08 $\mu$m in thickness at a carrier concentration of $6 \times 10^{17}$ cm$^{-3}$, a p-InP upper cladding layer of 1.5 $\mu$m in thickness at a carrier concentration of $8 \times 10^{17}$ cm$^{-3}$, and a contact layer 6 of p-InGaAs layer matched with InP (FIG. 2) respectively. The undoped InGaAsP strained multi-quantum well active layer has a well layer 3 of 6 nm in thickness with compression strain of 1.2% and a barrier layer of 10 nm in thickness, with the total thickness for five layers being 0.09 $\mu$m.

Figure 3:
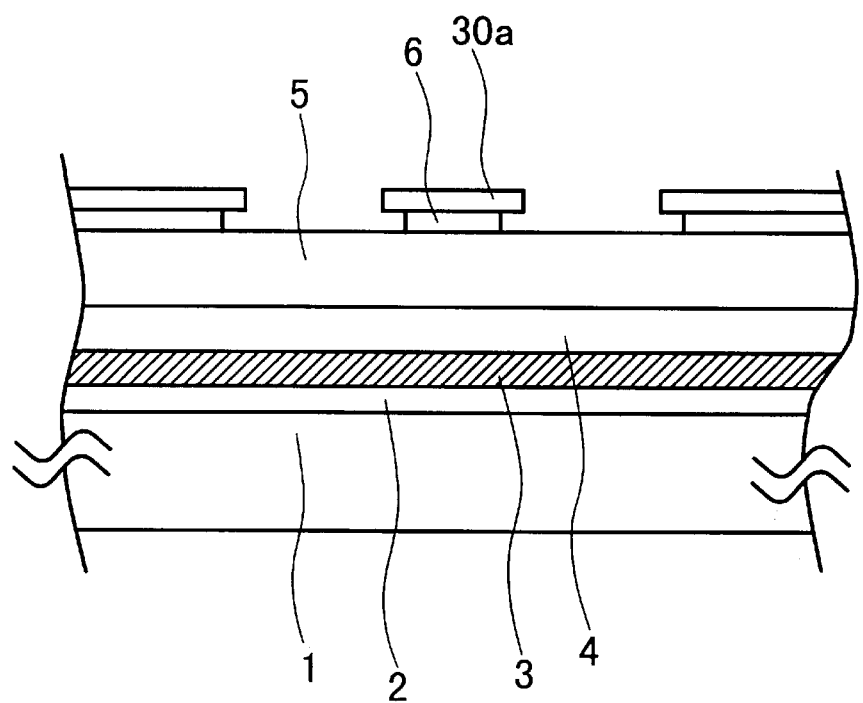
FIG. 3 is another cross sectional view of a semiconductor optical device according to an embodiment of this invention in the order of manufacturing step.
Figure 4:
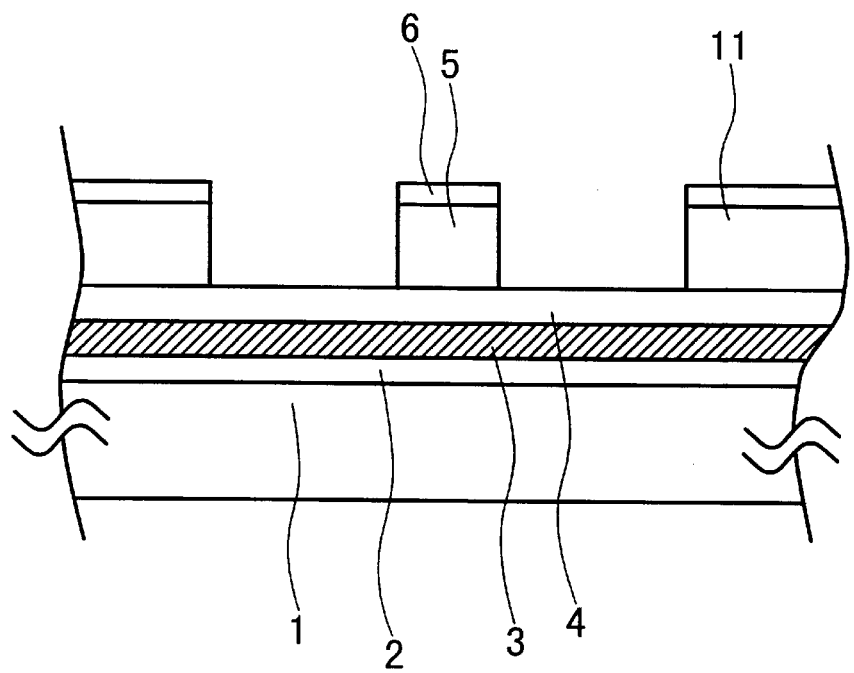
FIG. 4 is another cross sectional view of a semiconductor optical device according to an embodiment of this invention in the order of manufacturing step.

The contact layer 6 formed on the multi-layered substrate is removed by using a stripe of 1.7 $\mu$m in width and second stripes disposed on both sides thereof as an etching mask 30a (FIG. 3). In this step, a liquid mixture of phosphoric acid, hydrogen peroxide and water that etches only the InGaAs contact layer is used as an etching solution. Then, the etching mask is removed and a vertical stripe shape is formed by a liquid mixture of hydrochloric acid and phosphoric acid that selectively etches only the InPs layer using the InGaAs layer formed as a stripe as a mask. Etching is stopped on the guide layer 4 (FIG. 4).

Figure 5:
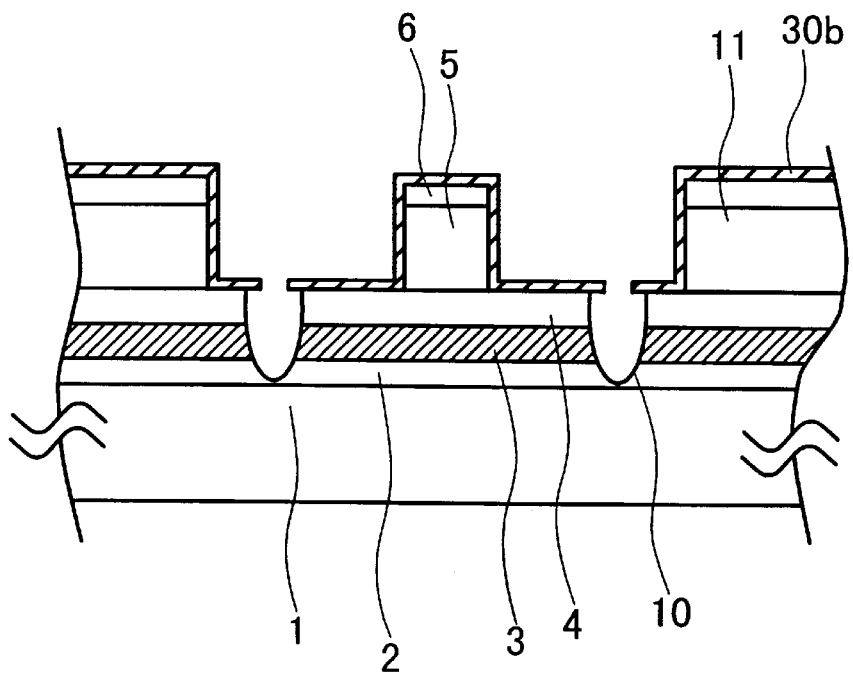
FIG. 5 is another cross sectional view of a semiconductor optical device according to an embodiment of this invention in the order of manufacturing step.

Then, grooves are formed to stacked semiconductors (3 and 4) by using an etching mask 30b. The width of the groove is about 2 $\mu$m to 10 $\mu$m (FIG. 5). The etching mask is removed and an insulation film 7 is formed. The insulation film in a region for disposing an upper electrode layer 8 is removed and the upper electrode layer 8 is formed covering the region (FIG. 1). In this step, it is important to cause the upper electrode layer 8 to extend to at least one of the second stripe regions 11. Then, as shown in FIG. 1 and FIG. 10, an electrode pad 8b is disposed in a thick layer region.

A layer 7 is an SiO$_2$ insulation film, with which the semiconductor layers 4, 5 are electrically insulated from the upper electrode 8 in an area other than the contact layer 6 in which a current flows through the contact layer to the active layer. A layer 9 is a lower electrode. A layer 11 is a p-InP layer. The p-InP layer has substantially the same height as the region for the mesa stripe. Therefore, this can prevent the mesa stripe region from damaging during the production process to attain high reliability and high yield of the device. A layer 8b is an electrode pad connected with the electrode 8 and connected with an external circuit by means of wire bonding or soldering connection. Since the electrode pad is lower than the mesa stripe by the thickness of the insulation film 7, the mesa stripe is less injured during wire bonding.

Figure 7:
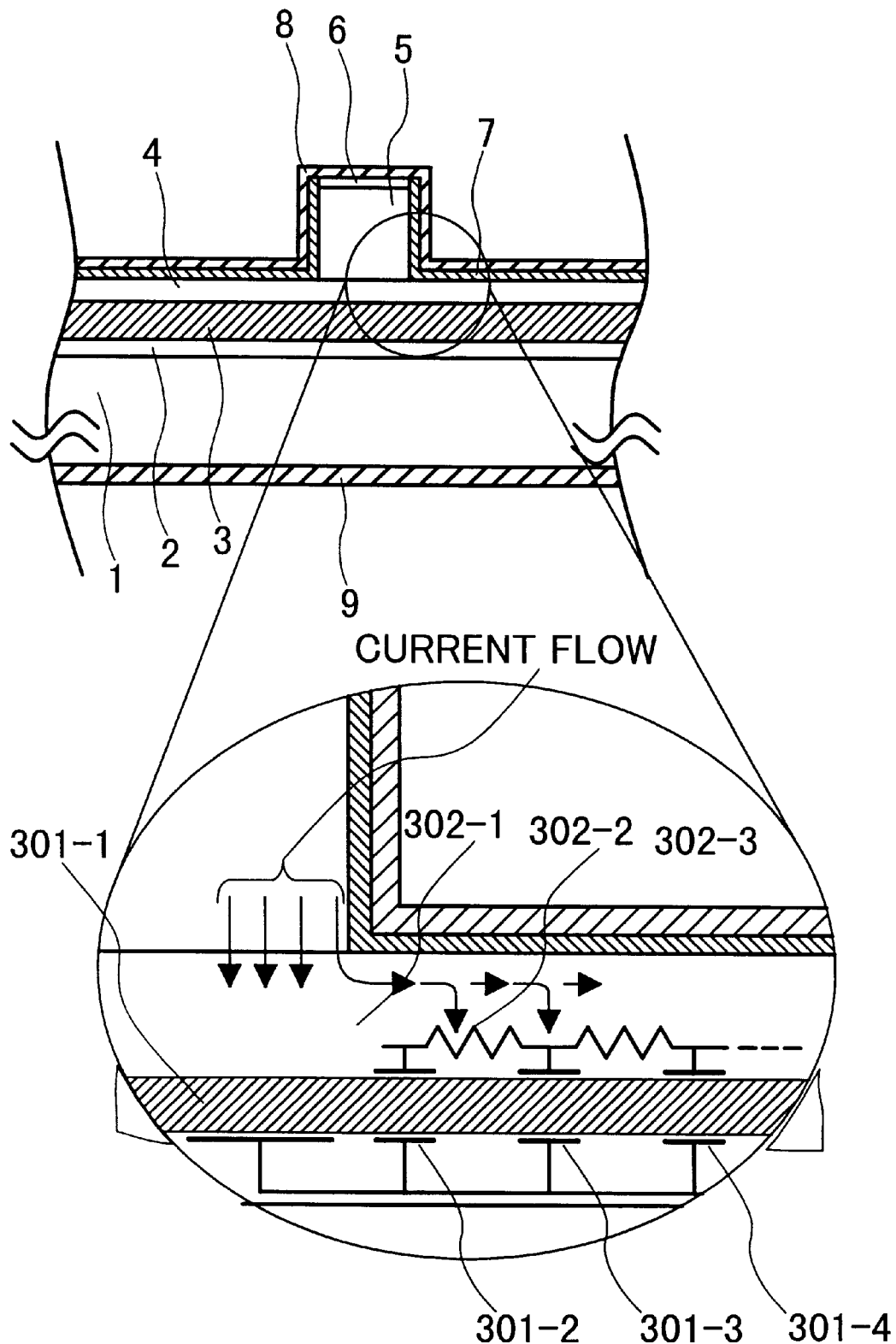
FIG. 7 is a view for explaining the distribution of parasitic elements by way of an equivalent circuit in an existent semiconductor laser.

A region 10 has a structure that obstructs conductivity. The region 10 is a groove of 2.5 μm in width and 0.3 μm in depth. A ladder type parasitic element exemplified in an equivalent circuit of FIG. 7 is interrupted by the groove. Therefore, the parasitic elements are decreased and the device can be operated at a high speed.

Comparison Between the Ridge Type Laser as the Typical Embodiment of the Prior Art and the Present Invention The present invention is compared with a ridge type laser as a conventional typical example.

Figure 6:
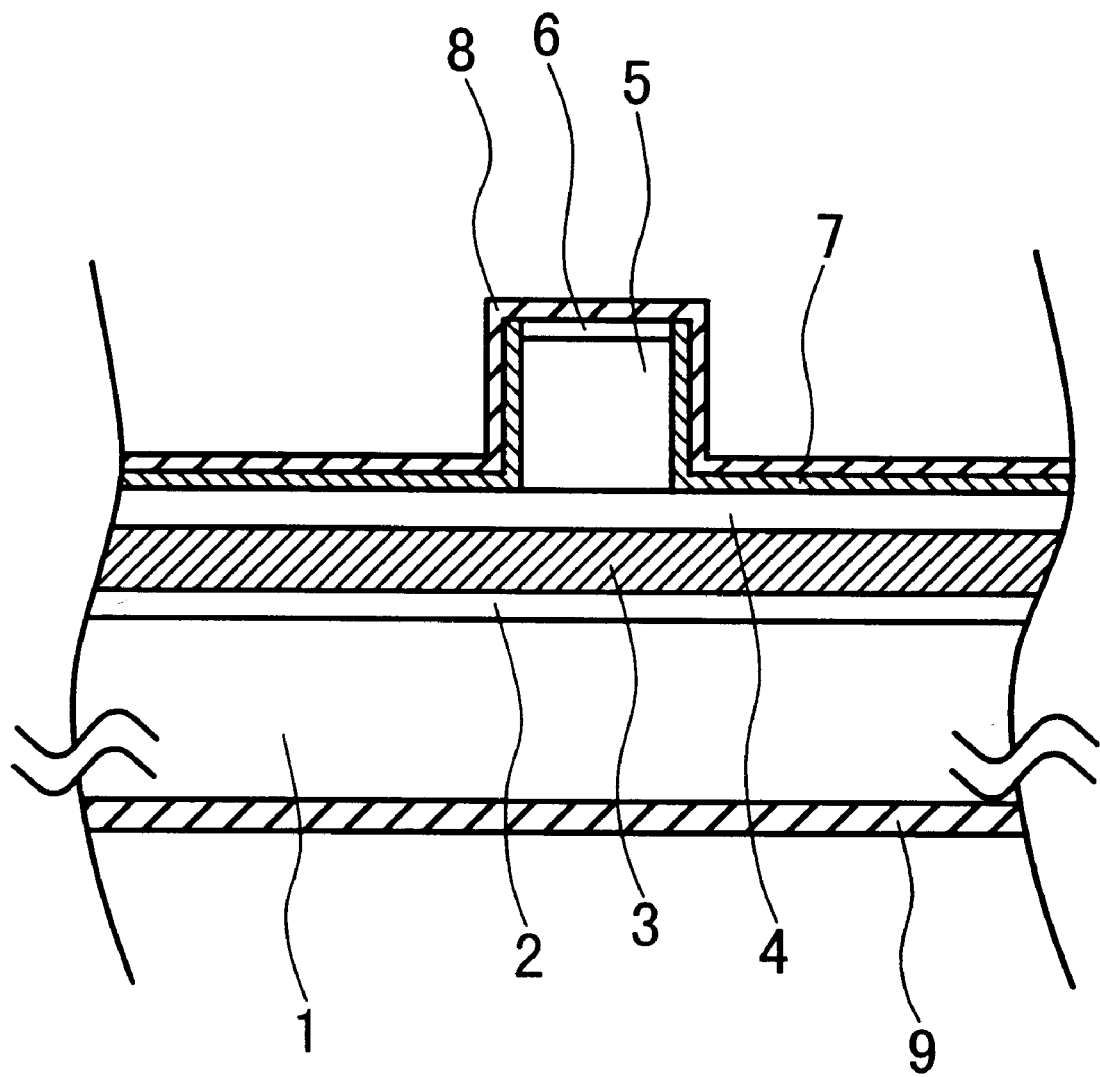
FIG. 6 is a cross sectional view taken along a plane perpendicular to the propagating direction of light in an embodiment of an existent semiconductor laser.

The ridge type laser device has a problem in view of an increase in operation speed. That is, in FIG. 6 shown previously, an injected current from the upper electrode flows downwards through the upper cladding layer 5 and reaches the active layer 3. However, lateral diffusion of current exists below the p-type guide layer 4. FIG. 7 shows a fragmentary enlarged view of the region. For easy understanding of this problem, a flow of current is schematically shown in FIG. 7. In FIG. 6 and FIG. 7, those portions identical with FIG. 1 carry identical reference numerals. Since the ladder type parasitic elements of capacitance and resistance are present as shown in FIG. 7 in the ridge type laser, current intrudes into the parasitic elements due to the lateral diffusion of the current to hinder an increase in the operation speed. In FIG. 7, 301-1 to 301-4 denote capacitance of the p-i-n semiconductor by way of the active layer and 302-1 to 302-3 denote resistance of the p-type guide layer. Since the ladder type parasitic elements generally have a response in large time constant, they hinder the increase in the operation speed of the laser. The effect of the parasitic elements is particularly conspicuous when the p-type guide layer 4 is thickened or the carrier concentration therein is increased. In this case, the former is needed so as to prevent stresses in the insulation film 7 or the electrode 8 from propagating to the active layer, while the latter is needed to decrease the device resistance of the laser. Accordingly, the fact is that they form a trade off relation with respective to the parasitic elements. Further, in the ridge type laser of the structure shown in FIG. 6, since the ridge stripe protrudes from the semiconductor substrate, this also results in a problem that the reliability is low because of the damage to the stripe portion upon processing such as deposition of the insulation film or the formation of the electrode. The invention of the present application can overcome such problems.

Figure 11:
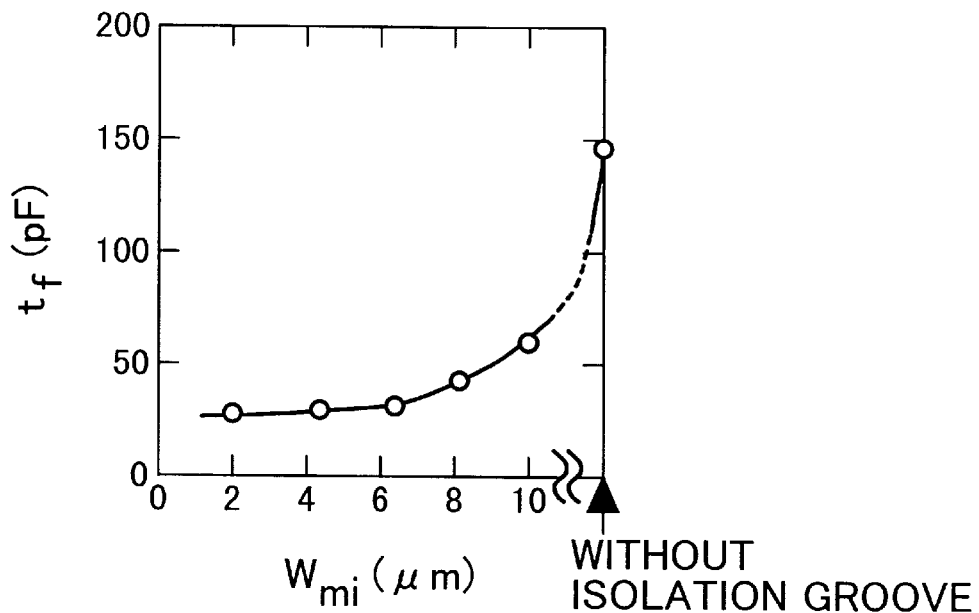
FIG. 11 is a graph showing an embodiment of the relation between a falling time, a mesa stripe and a structure that obstructs conductivity according to this invention.
Figure 12:
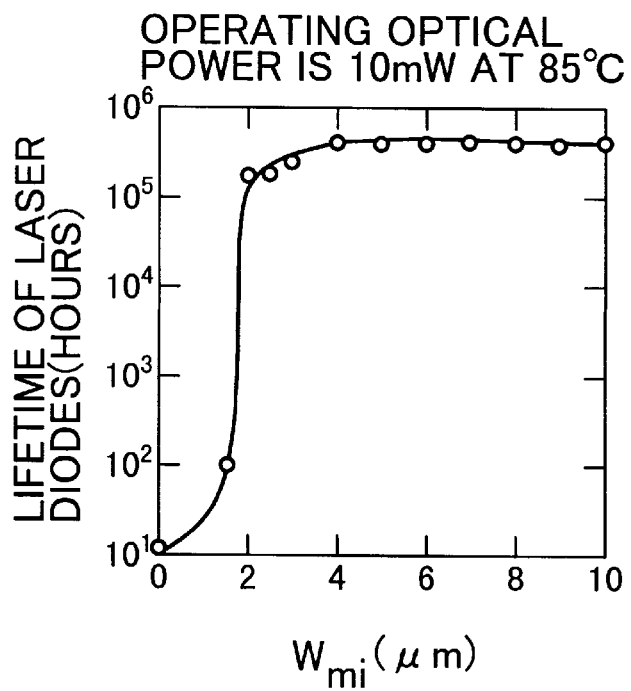
FIG. 12 is a diagram showing an example of the relation between an estimated lifetime, a mesa stripe and a structure that obstructs conductivity according to this invention.

Then, a description is to be made specifically for a way of disposing the conductivity-obstructing portion in the present invention. FIG. 11 shows the relation between the distance $W_{mi}$ between the groove and the mesa stripe and the falling time $t_f$ of the laser optical power. (More strictly, the distance $W_{mi}$ is the shortest distance between the groove and the mesa stripe, for example, as shown in FIG. 1, namely, the shortest distance between the lateral side of the stripe and one end of the groove. In the example of FIG. 1, this means the illustrated $W_{mi}$, namely, the shortest distance between the lateral side on the right of the stripe and one end on the left of the groove.) The abscissa indicates the distance $W_{mi}$ between the groove and the mesa stripe and the ordinate indicates the falling time $t_f$ of the laser optical power. In a case where the groove is not present (no groove) $t_f$ is extremely long as 150 ps. On the other hand, in a case where the groove is provided, $t_f$ is shorter and $t_f$ of 30 ps or less is obtained, particularly, in a case where $W_{mi}$ is 7 μm or less. $t_f$ changes with $W_{mi}$ because the parasitic elements are arranged in a manner of distributed constant. Then, $W_{mi}$ and reliability were examined. FIG. 12 shows the relation between $W_{mi}$ and the estimated lifetime obtained by an aging test in the semiconductor laser of this embodiment. The abscissa indicates the distance $W_{mi}$ between the groove and the mesa stripe and the ordinate indicates the estimated lifetime. The aging test was conducted at 85° C. with a constant optical power of 10 mW. As can be seen from FIG. 12, it can be recognized that a high reliability of $1.8 \times 10^5$ hours or more can be obtained at $W_{mi}$ of 2 μm or more. From the result of FIG. 11 and FIG. 12, it can be understood that $W_{mi}$ is preferably within a range of 2 μm or more and not exceeding 10 μm, more preferably, 2 μm or more and 7 μm or less.

In the semiconductor laser of this embodiment, $W_{mi}$=5 μM. Then, the device provided usual laser characteristics of a threshold current of 10 mA and a slope efficiency of 0.42 W/A at 25° C., and the threshold current of 22 mA and the slope efficiency of 0.23 W/A at 85° C., in a cavity length of 300 μm and end face coating 50% forward and 90% backward. These laser characteristics are equal with those of the ridge type. Further, the falling time is extremely short as 35 ps while reflecting excellent reduced capacity and high-speed operation of 2.5 Gb/s could be attained in a temperature range of −40° C. to 85° C. Further, high reliability of $2.3 \times 10^5$ hours could be obtained at 85° C., 10 mW.

Embodiment 2

A second embodiment of the present invention is to be explained with reference to a cross sectional structure shown in FIG. 8. This embodiment shows a semiconductor laser of a structure having an ion-implanted region in the structure that obstructs conductivity.

This is a 1.3 μm emitted semiconductor identical with that of Embodiment 1 except for the structure of the conductivity obstructing structure. Accordingly, detailed explanations therefor will be omitted. The structure that obstructs conductivity is an ion implanted region 10 at an impurity concentration of $1 \times 10^{18}$ cm$^{-3}$ and of a 4 μm in width formed by ion implanting H, i.e., hydrogen atoms using a photoresist as a mask. In group III–V semiconductor such as InP, InGaAsP, or InGaAlAs, since the resistivity increases to show semi-insulating property by the ion implantation of H, the parasitic elements exemplified in FIG. 7 can be interrupted by the ion implantation region.

Figure 8:
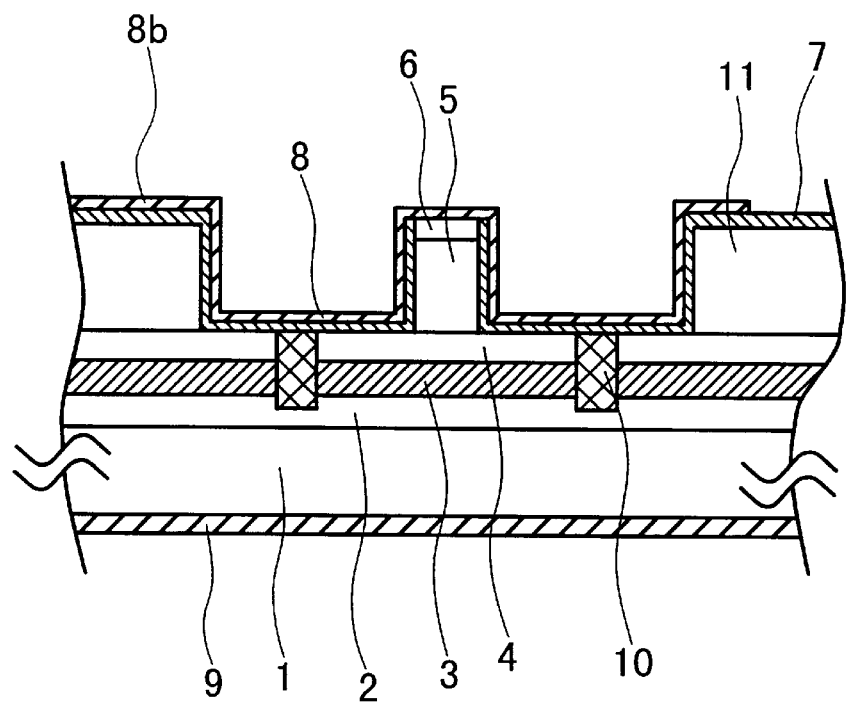
FIG. 8 is a cross sectional view taken along a plane perpendicular to the propagating direction of light in other embodiment of this invention.

In FIG. 8, the distance $W_{mi}$ between the ion injection region and the mesa stripe of the semiconductor laser in this embodiment (more strictly, this is the shortest distance, for example, between the groove and the end of the ion implantation region, namely, the shortest distances among the distance between one lateral side of the stripe and the one end of the ion implantation region. Referring to the right in a pair of right and left ion injection regions as an example, it means the shortest distance between the lateral side on the right of the stripe and one end on the left of the ion implantation region) is 6 μm. In addition, laser characteristics at the threshold current of 8 mA and the slope efficiency of 0.47 W/A at 25° C., and at the threshold current of 17 mA and the slope efficiency of 0.28 W/A were obtained, with the cavity length of 250 μm, with the end face coating of 70% forward and 90% backward were obtained. The characteristics are identical with those of usual ridge type. Further, reflecting the excellent reduced capacitance, the falling time was as short as 38 ps and a high-speed operation of 2.5 Gb/s at −40 to 85° C. could be attained. Further, a high reliability of $2.3 \times 10^5$ hours could be obtained at 85° C., 10 mW. While the width of the ion implantation region was 4 μm in this example, the implantation region may be allowed to extend as far as the p-InP layer 11. Further, the ion species are not restricted only to H but those elements such as Fe, Ti, F, He, Ne, Ar and Xe which are introduced into the group III–V semiconductor to make the semiconductor material semi-insulative can also be used.

Embodiment 3

Figure 9:
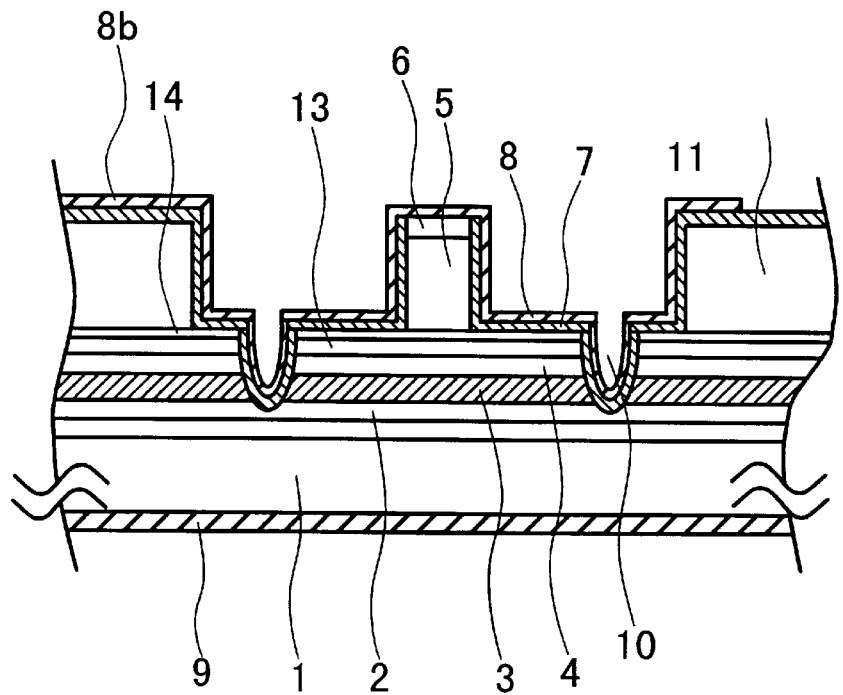
FIG. 9 is a cross sectional view taken along a plane perpendicular to the propagating direction of light in other embodiment of this invention.

In a third embodiment, this invention is applied to a semiconductor laser emitted 1.3-μm wavelength for optical fiber communication using InGaAlAs as quantum wells active layer. FIG. 9 shows a structure taken along a cross section perpendicular to the propagating direction of laser light.

In FIG. 9, an n-InP substrate 1 serves also as a lower cladding layer. A layer 12 is an n-InAlAs second lower cladding layer at a carrier concentration of $1\times10^{18}$ cm$^{-3}$ and a thickness of 0.1 μm, a layer 2 is an n-InGaAlAs guide layer at a carrier concentration of $1\times10^{18}$ cm$^{-3}$ and a thickness of 0.08 μm, a layer 3 is an undoped InGaAlAs strain-compensated multi-quantum wells active layer, a layer 4 is a p-InGaAlAs guide layer at a carrier concentration of $6\times10^{17}$ cm$^{-3}$ and a thickness of 0.08 μm, a layer 13 is a p-InAlAs second cladding layer at a carrier concentration of $9\times10^{17}$ cm$^{-3}$ and a thickness of 0.05 μm, and a layer 14 is a p-InGaAlAs etching stopper layer at a carrier concentration of $5\times10^{17}$ cm$^{-3}$ and a thickness of 0.05 μm. The undoped InGaAlAs strain-compensated multi-quantum wells active layer consists of seven wells separated by barriers. The well layer has a thickness of 6 nm and an compression strain of 1.4% and a barrier layer has a thickness of 8 nm with a tensile strain of 0.6%. The total thickness of the active layer is 0.106 μm.

Since the InAlAs layer 12 is etched with an etching solution of phosphoric acid and hydrochloric acid, an etching stopper layer 13 is disposed, so that selective etching can be applied. A layer 5 is a p-InP first upper cladding layer at a carrier concentration of $1\times10^{18}$ cm$^{-3}$ and a thickness of 1.5 μm. Then, the region including a light-emitting portion constitutes a ridge type mesa stripe of 1.6 μm in width. A layer 6 is a contact layer for ohmic contact with an upper electrode 8, for which InGaAs lattice-matched with the InP substrate is used. A layer 7 is an $SiO_2$ insulation film which electrically insulates the semiconductor layers 4 and 5 and the upper electrode 8 except for the area of the contact layer 6, and current flows through the contact layer to the active layer. A layer 9 is an lower electrode. A region 11 is a p-InP layer having substantially the same height as the mesa stripe region 5 and can prevent the mesa stripe from damaging during the production process. Accordingly, high reliability and high yield of the device can be attained. A layer 8b is an electrode pad in contiguous with the electrode 8, which is connected by way means of wire bonding or soldering connection to an external circuit. Since the electrode pad is lower than the mesa stripe by the thickness of the insulation film 7, the mesa stripe is less injured during wire bonding.

A groove 10 is a structure that obstructs conductivity. The groove has 2.5 μm in width and 0.5 μm in depth. Ladder type parasitic elements shown in the equivalent circuit of FIG. 7 are interrupted by the groove. Accordingly, the parasitic elements are decreased and high-speed operation is enabled. In this embodiment, since the upper second cladding layer 12 and the etching stopper layer 13 are present and the thickness of the laminate mounted above the active layer is increased, the resistive component of the parasitic elements (corresponding to reference numeral 302 in FIG. 7) is decreased. Therefore, the effect of the ladder type parasitic elements in the lateral direction shown in FIG. 7 is increased. Accordingly, the structure that obstructs conductivity of the invention can be said to be an extremely effective structure. $W_{mi}$=6 μm in the semiconductor laser in this embodiment and provided laser characteristics at the threshold current of 7 mA and the slope efficiency of 0.24 W/A at 25° C. and the threshold current of 13.5 mA and the slope efficiency of 0.19 W/A at 85° C., with a cavity length of 200 μm and the end face coating of 40% forward and 90% backward. The characteristics are equal with those of the usual ridge type laser. Further, reflecting the excellent reduced capacitance, the falling time is as extremely short as 30 ps and a high-speed operation of 10 Gb/s at 0° C. to 85° C. could be attained. Further, a high reliability of $2.5\times10^5$ hours at 85° C., 10 mW could be obtained.

Embodiment 4

A fourth example according to the invention is applied to an integrated optical device in which a semiconductor laser and an EA (Electro-Absorption) optical modulator are integrated. The invention may be satisfactorily applied to such an integrated optical device containing the semiconductor laser.

Figure 13:
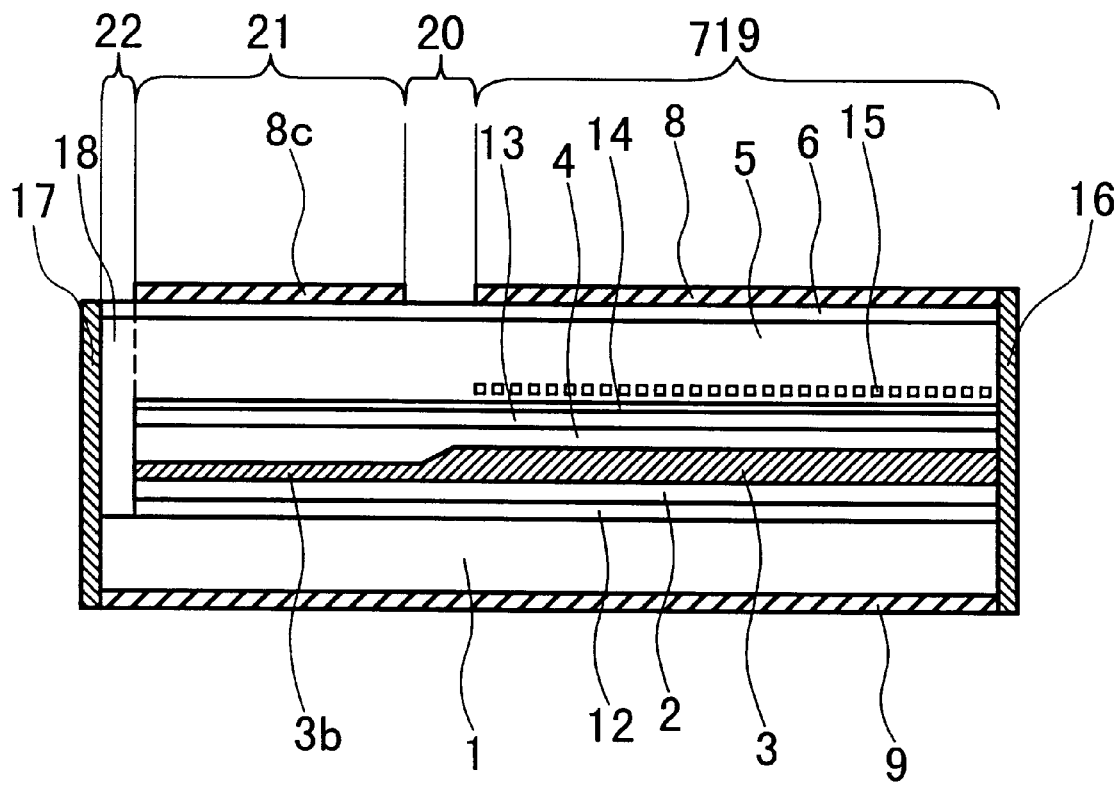
FIG. 13 is a vertical cross sectional view parallel with the mesa stripe showing another embodiment of this invention.

FIG. 13 shows a longitudinal cross sectional view in a plane parallel with the ridge mesa stripe of an integrated optical device. Each of regions is mounted on an n-InP substrate 1. A region 19 is a laser region of an integrated optical device, a region 21 is an EA modulator region and a region 20 is a transition region connecting the region 19 and the region 21.

In the laser region, a layer 3 is an active layer region that oscillates at a wavelength of 1.55 μm.

The active layer region comprises an undoped InGaAlAs strain-compensated multi-quantum well active layer. As an actual example of the constitution, the well layer has 6 nm in thickness and 1.4% compression strain and a barrier layer has 8 nm in thickness and 0.6% tensile strain. The region has ten layers in all, with the total film thickness being 0.148 μm. A layer 12 is an n-InAlAs second lower cladding layer at a carrier concentration of $1\times10^{18}$ cm$^{-3}$ and a thickness of 0.1 μm. A layer 2 is an n-InGaAlAs guide layer at a carrier concentration of $1\times10^{18}$ cm$^3$ and a thickness of 0.08 μm. A layer 4 is a p-InGaAlAs guide layer at a carrier concentration of $0.5\times10^{17}$ cm$^3$ and a thickness of 0.08 μm. A layer 13 is a p-InAlAs second upper cladding layer at a carrier concentration of $4\times10^{17}$ cm$^{-3}$ and a thickness of 0.05 μm, a layer 14 is a p-InGaAlAs etching stopper layer at a carrier concentration of $1\times10^{17}$ cm$^{-3}$ and a thickness of 0.05 μm. A layer 5 is a p-InP first upper cladding layer at a carrier concentration of $1\times10^{18}$ cm$^{-3}$ and a thickness of 1.5 μm. A region including a light-emitting portion constitutes a ridge type mesa stripe of 1.6 μm in width. A layer 6 is a contact layer for ohmic contact with an upper electrode 8 for which InGaAs lattice matched with the InP substrate is used. A layer 9 is a lower electrode and reference numeral 16 denotes a back end face reflection film of a semiconductor layer having 90% reflectance.

The semiconductor laser device of this embodiment provides a single oscillation mode by a DFB (Distributed Feedback) structure of a diffraction grating comprising InGaAs. In the EA modulation region 21, the band gap of the multi-quantum well layer 3b is prepared such that it is larger than that of the multi-quantum well layer of the laser region. Reference numeral 8c is an electrode for driving the EA modulator. For preparing different band gaps collectively by using a selective growing method for the multi-quantum well active layer, a transition region 20 of the band gaps is present. Reference numeral 17 denotes an anti-reflection film with a reflectance of 0.6% or less and a window structure 18 of an InP layer is disposed for further reducing an effective reflectance.

In the modulator-integrated device, the laser portion always conducts laser beam oscillation and the laser beam is modulated at a high speed by the EA modulator disposed in front of it. The multi-quantum well layer 3b in the modulator absorbs the laser beam by the quantum confining Stark effect when an inverted voltage is applied to the electrode 8c of the modulator and the laser beam does not emit externally. When the voltage is not applied to an electrode 8c above the modulator, the laser beam is not absorbed by the modulator but is outputted externally.

Figure 14:
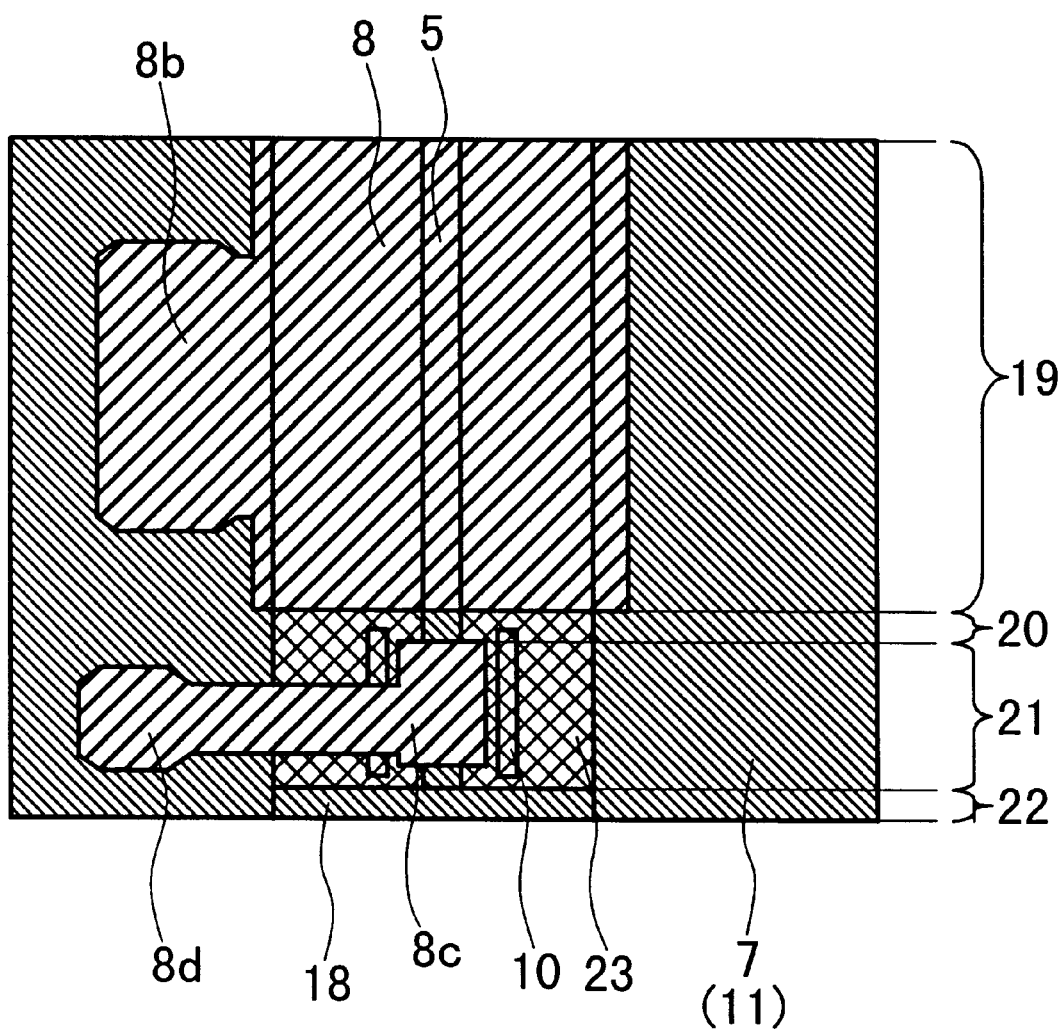
FIG. 14 is an upper plan view showing another embodiment of this invention.

FIG. 14 is a top plan view of this embodiment. Reference numerals in the figure denote identical portions described so far. Since the EA modulator (electro-absorption modulator) requires high-speed performance, the EA portion is disposed in a groove 10 as the structure that obstructs conductivity in this embodiment. The groove is recessed as far as the transition region. Further, a polymeric resin, for example, a polyimide film 23 is buried on the sides of the mesa stripe to also decrease the capacitance relative to the insulation film, thereby further reducing the capacitance.

Figure 15:
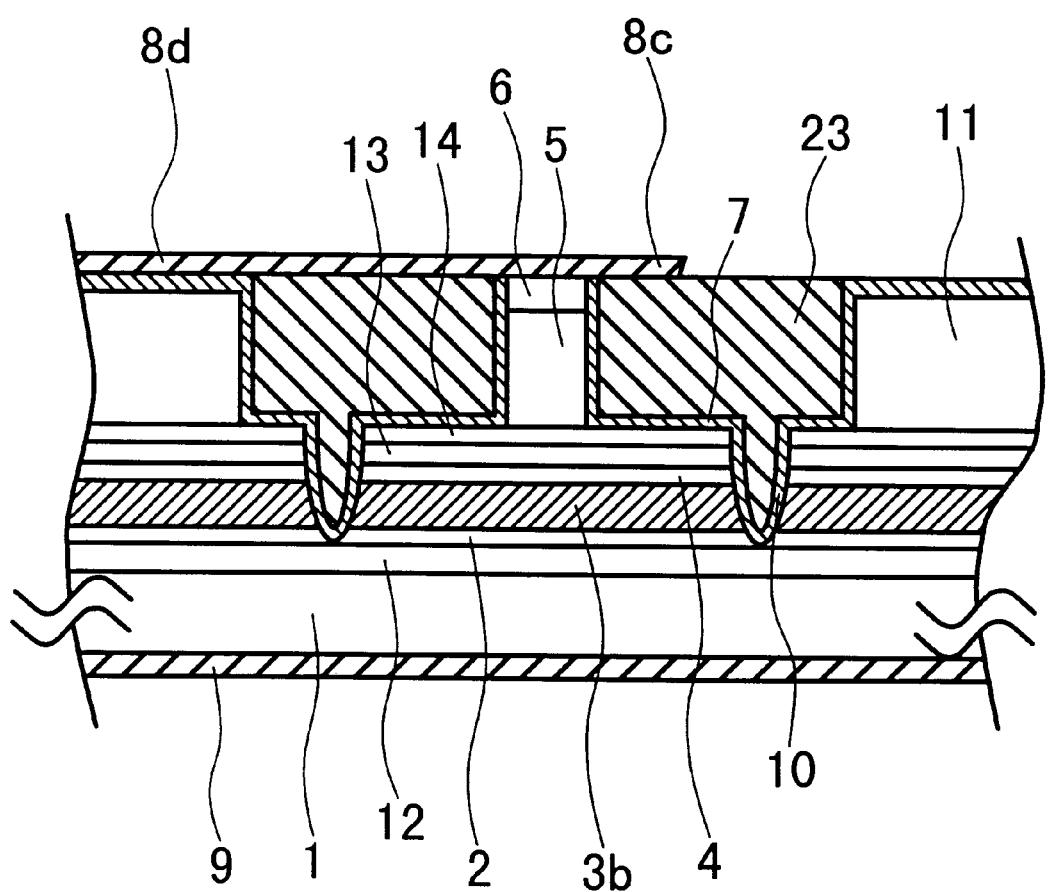
FIG. 15 is a cross sectional view taken along a plane perpendicular to the propagating direction of light in another embodiment of this invention.

A cross sectional structure of the EA is shown in FIG. 15. This has the same configuration as that in Embodiment 1 excepting that the polyimide film 23 is buried on the sides of the mesa stripe and that the multi-quantum well layer 3b is a band gap of EA. The falling time of the EA modulator integrated optical device is as extremely short as 15 ps and a maximum transmission distance of 40 km to usual dispersed fibers by high frequency response characteristics of 35 GHz and at a transmission rate of 20 Gb/s by chirping could be obtained. Further, a high reliability of $2 \times 10^6$ hours at 65° C. and 10 mW could also be obtained for the lifetime.

While descriptions have been made to the EA type optical modulated integrated optical device in this embodiment, it will be apparent that the invention is applicable also to an optically modulated integrated optical device of a Mach-Zehnder interferometer type optically modulated integrated optical device. It will be also apparent that the invention is applicable also to a mode magnifier integrated optical device for converting the size of the optical mode. Further, it will be apparent that the invention is applicable also to a laser array in which lasers are integrated in the lateral direction.

According to the embodiment of this invention, it is possible to ensure high speed operation while keeping the high reliability in the ridge type semiconductor optical device.

What is claimed is:

1. A semiconductor optical device comprising:
   a first cladding layer, a first guide layer, an active layer, a second guide layer and a ridge waveguide stripe comprising a second cladding layer extending in a light-waveguiding direction disposed successively on a semiconductor substrate; and
   a first and a second semiconductor ridge waveguide stripe protected layer, which are formed substantially at an identical height with the ridge waveguide stripe and spaced apart from the ridge waveguide stripe, and which are disposed on both sides of the ridge waveguide stripe,
   wherein a first and a second recessed region lower than the top of the ridge waveguide stripe are present between each of the first and the second semiconductor ridge waveguide stripe protected layer and the ridge waveguide stripe; and
   a first and a second region for obstructing the conductivity of the active layer is present in the same direction as the light-waveguiding direction of the ridge waveguide stripe in the first and the second recessed region respectively, and the shortest distance or the shortest gap between one end of the ridge waveguide stripe and one end of the second region is 2 $\mu$m or more and less than 10 $\mu$m.

2. The semiconductor optical device according to claim 1, further comprising:
   a first electrode disposed on the side of the first cladding layer;
   a second electrode disposed on the side of the second cladding layer, the second electrode being formed continuously from the top of the ridge waveguide stripe of the second cladding layer by way of the first or second recessed regions to a portion above the first or second semiconductor ridge waveguide stripe protection layer; and
   an electrode pad region formed at a portion on the first or second semiconductor ridge waveguide stripe protection layer.

3. The semiconductor optical device according to claim 1, wherein the first cladding type has a first conduction type and the second cladding layer has a second conduction type different from the first conduction type.

4. The semiconductor optical device according to claim 1, wherein the semiconductor optical device is a semiconductor laser or a modulator integrated semiconductor laser.

5. The semiconductor optical device according to claim 1, wherein the second region is disposed continuously from the upper end to the lower end of the active layer so as to decrease the conductivity thereof.

6. The semiconductor optical device, comprising:
   a first cladding layer, a first guide layer, an active layer, a second guide layer and a ridge waveguide stripe comprising a second cladding layer extending in a light-waveguiding direction disposed successively on a semiconductor substrate; and
   a first and a second semiconductor ridge waveguide stripe protected layer, which are formed substantially at an identical height with the ridge waveguide stripe and spaced apart from the ridge waveguide stripe, and which are disposed on both sides of the ridge waveguide stripe,
   wherein a first and a second recessed region lower than the top of the ridge waveguide stripe are present between each of the first and second semiconductor ridge waveguide stripe protection layers and the ridge waveguide stripe; and
   a gap is disposed in the first and the second recessed region from the upper end to the lower end of the active layer in the same direction as the light-waveguiding direction of the ridge waveguide stripe, and the shortest distance or the shortest interval between one end of the ridge waveguide stripe and one end of the gap is 2 $\mu$m or more and less than 10 $\mu$m.

7. The semiconductor optical device according to claim 6, further comprising:
   a first electrode disposed on the side of the first cladding layer;
   a second electrode disposed on the side of the second cladding layer, the second electrode being formed continuously from the top ridge waveguide stripe of the second cladding layer by way of a portion above the gap to a portion above the first or second semiconductor ridge waveguide protection layer; and an electrode pad region formed at a portion on the first or second semiconductor ridge waveguide stripe protection layer.

8. The semiconductor optical device according to claim 6, wherein the first cladding layer has a first conduction type and the second cladding layer has a second conduction type different from the first conduction type.

9. The semiconductor optical device according to claim 6, wherein the semiconductor optical device is a semiconductor laser or a modulator integrated semiconductor laser.

10. A semiconductor optical device, comprising:

a first cladding layer, a first guide layer, an active layer, a second guide layer and a ridge waveguide stripe comprising a second-cladding layer extending in an optical waveguide direction disposed successively on a semiconductor substrate; and a first and a second semiconductor ridge waveguide stripe protection layer, which are formed substantially at an identical height with the ridge well guide stripe and spaced apart from the ridge waveguide stripe, and which are disposed on both sides of the ridge waveguide stripe, wherein a first and a second-region lower than the top of the ridge waveguide stripe are present between each of the first and second semiconductor ridge waveguide stripe protection layers and the ridge waveguide stripe; and wherein said semiconductor optical device further includes at least one of:

(a) an ion implanted region for reducing the conductivity of the active layer is present in the first region in the direction identical with the light-waveguiding direction of the ridge waveguide stripe and the shortest distance or the shortest gap between one end of the ridge waveguide stripe and one end of the ion implanted region is 2 μm or more and less than 10 μm;

(b) a first and a second region for obstructing the conductivity of the active layer is present in the same direction as the light-waveguiding direction of the ridge waveguide stripe in the first and the second recessed region respectively, and the shortest distance or the shortest gap between one end of the ridge waveguide stripe and one end of the second region is 2 μm or more and less than 10 μm; and (c) a gap is disposed in the first and the second recessed region from the upper end to the lower end of the active layer in the same direction as the light-waveguiding direction of the ridge waveguide stripe, and the shortest distance or the shortest interval between one end of the ridge waveguide stripe and one end of the.

11. The semiconductor optical device according to claim 10, further comprising:

a first electrode disposed on the side of the first cladding layer;

a second electrode disposed on the side of the second cladding layer, the second electrode being formed continuously from the top of the ridge waveguide stripe of the second cladding layer by way of the first and second ion implanted regions to a portion on the first or second semiconductor ridge waveguide stripe protection layer; and an electrode pad region formed at a portion on the first or second semiconductor ridge waveguide stripe protection layer.

12. The semiconductor optical device according to claim 10, wherein the first cladding type has a first conduction type and the second cladding layer has a second conduction type different from the first conduction type.

13. The semiconductor optical device according to claim 10, wherein the semiconductor optical device is a semiconductor laser or a modulator integrated semiconductor laser.

14. The semiconductor optical device according to claim 10, wherein said semiconductor optical device includes at least (a) an ion implanted region for reducing the conductivity of the active layer present in the first region in the direction identical with the light-waveguiding direction of the ridge waveguide stripe and the shortest distance where the shortest gap between one end of the ridge waveguide stripe and one end of the ion implanted region is 2 μm or more and less than 10 μm.

15. The semiconductor optical device according to claim 12, wherein said semiconductor optical device includes at least (a) an ion implanted region for reducing the conductivity of the active layer present in the first region in the direction identical with the light-waveguiding direction of the ridge waveguide stripe and the shortest distance where the shortest gap between one end of the ridge waveguide stripe and one end of the ion implanted region is 2 μm or more and less than 10 μm.

16. The semiconductor optical device according to claim 13, wherein said semiconductor optical device includes at least (a) an ion implanted region for reducing the conductivity of the active layer present in the first region in the direction identical with the light-waveguiding direction of the ridge waveguide stripe and the shortest distance where the shortest gap between one end of the ridge waveguide stripe and one end of the ion implanted region is 2 μm or more and less than 10 μm.

* * * * *